(12) United States Patent
Prodic et al.

(10) Patent No.: US 8,085,024 B2
(45) Date of Patent: *Dec. 27, 2011

(54) SELF-TUNING DIGITAL CURRENT ESTIMATOR FOR LOW-POWER SWITCHING CONVERTERS

(75) Inventors: Aleksandar Prodic, Toronto (CA); Zdravko Lukic, Toronto (CA); Zhenyu Zhao, North York (CA); Sheikh Mohammad Ahsanuzzaman, Toronto (CA)

(73) Assignee: Exar Corporation, Fremont, CA (US)

( * ) Notice: Subject to any disclaimer, the term of this patent is extended or adjusted under 35 U.S.C. 154(b) by 420 days.

This patent is subject to a terminal disclaimer.

(21) Appl. No.: 12/423,338

(22) Filed: Apr. 14, 2009

(65) Prior Publication Data

US 2009/0267582 A1 Oct. 29, 2009

Related U.S. Application Data

(60) Provisional application No. 61/048,655, filed on Apr. 29, 2008.

(51) Int. Cl.
*G05F 1/575* (2006.01)
(52) U.S. Cl. .......... 323/283; 323/286; 323/299
(58) Field of Classification Search .......... 323/283, 323/286, 299
See application file for complete search history.

(56) References Cited

U.S. PATENT DOCUMENTS

| | | | |
|---|---|---|---|
| 4,315,316 A * | 2/1982 | Boros et al. ............ 702/64 |
| 5,831,837 A | 11/1998 | Coyne et al. | |
| 5,966,042 A | 10/1999 | Werner et al. | |
| 6,031,361 A * | 2/2000 | Burstein et al. ............ 323/224 |
| 6,225,795 B1 * | 5/2001 | Stratakos et al. ............ 323/283 |
| 7,236,920 B2 | 6/2007 | Grochowski et al. | |
| 7,288,924 B2 | 10/2007 | Trandafir et al. | |
| 7,391,195 B2 * | 6/2008 | Tiew et al. ............ 323/283 |
| 7,652,459 B2 * | 1/2010 | Abu Qahouq et al. ........ 323/283 |
| 7,821,237 B2 * | 10/2010 | Melanson ............ 323/222 |
| 2006/0276915 A1 | 12/2006 | Kelly | |
| 2007/0108953 A1 * | 5/2007 | Latham ............ 323/283 |
| 2009/0039852 A1 * | 2/2009 | Fishelov et al. ............ 323/283 |
| 2009/0267582 A1 * | 10/2009 | Prodic et al. ............ 323/283 |
| 2010/0141230 A1 * | 6/2010 | Lukic et al. ............ 323/283 |

OTHER PUBLICATIONS

Mattavelli, "Digital control of dc-dc boost converters with inductor current estimation", Feb. 2004, IEEE, pp. 74-80.*
Peng, et al., "Overload Protection in Digitally Controlled DC-DC Converters," Proc. IEEE Power Electronics Specialist Conference, Jun. 2006, 6 pages.
Bibian et al., "High Performance Predictive Dead-Beat Digital Controller for DC Power Supplies," IEEE Trans. Power Electron, 7 pages, May 2002. vol. 17.
Forghani-Zadeh, et al., "Current-Sensing Techniques for DC-DC Converters", Proc. IEEE MWSCAS, Aug. 2002, pp. 577-580.
Givelin, et al., "On-Chip Over-Current and Open-Load Detection for a Power MOS High-Side Switch: a CMOS Current Source Approach", Proc. European Conference Power Electronics and Applications, 1993, pp. 197-200.
Yuvarajan, et al., "Power Conversion And Control Using A Current-Sensing MOSFET", Proc. Midwest Symposium Circuits and Systems (MWSCAS), 1992, pp. 166-169.

(Continued)

*Primary Examiner* — Jeffrey Sterrett
(74) *Attorney, Agent, or Firm* — Fliesler Meyer LLP

(57) ABSTRACT

A switched mode power can use a digital controller to control the switching of the at least one switch of the switched mode power supply. The current through the power inductor can be estimated using a self-tuning digital current estimator.

20 Claims, 12 Drawing Sheets

OTHER PUBLICATIONS

Chen, et al., "Integrated Current Sensing Circuits Suitable for Step-Down DC-DC Converters," IEE Electronics Letters, Feb. 2004, pp. 200-201.

Lee, et al., "A Monolithic Current-Mode CMOS DC-DC Converter With On-Chip Current-Sensing Technique," IEEE Journal Of Solid-State Circuits, Jan. 2004, pp. 3-14, vol. 39, No. 1.

Midya, et al., "Sensorless Current Mode Control—An Observer-Based Technique For Dc-Dc Converters," In Proc. IEEE Power Electronics Specialist Conference, Jun. 1997, pp. 197-202.

Midya, et al., "Sensorless Current Mode Control—An Observer-Based Technique for DC-DC Converters," IEEE Trans. Power Electronics, vol. 16, pp. 522-526, Jul. 2001.

Dallago, et al., "Lossless Current Sensing in Low-Voltage High-Current DC/DC Modular Supplies," IEEE Trans. Ind. Electronics, Dec. 2000, pp. 1249-1252, vol. 47.

Hua, et al., "Design Considerations Of Time Constant Mismatch Problem For Inductor DCR Current Sensing Method," Proc. IEEE Applied Power Electronics Conference, 2006, pp. 1368-1374.

Garcea et al., "Digital Auto-Tuning System For Inductor Current Sensing In VRM Applications," In Proc. IEEE Applied Power Electronics Conference, 2006, pp. 493-498.

Forghani-Zadeh, et al., "An Accurate, Continuous, And Lossless Self-Learning CMOS Current-Sensing Scheme For Inductor-Based DC-DC Converters," IEEE Journal Of Solid-State Circuits, Mar. 2007, pp. 665-679, vol. 42.

Leung et al., "Dynamic Hysteresis Band Control Of The Buck Converter With Fast Transient Response," IEEE Transactions On Circuits And Systems—II: Express Briefs, Jul. 2005, pp. 398-402, vol. 52.

Lukic, et al., "Multibit Σ-Δ PWM Digital Controller IC for DC-DC Converters Operating at Switching Frequencies beyond 10 MHz", IEEE Transactions on Power Electronics, Sep. 2007, pp. 1693-1707, vol. 22, No. 5.

Rahman, et al., "Multimode Digital SMPS Controller IC for Low-Power Management", ISCAS 2006, pp. 5327-5330.

Xiao, et al., "A 4-μA Quiescent-Current Dual-Mode Digitally Controlled Buck Converter IC for Cellular Phone Applications", IEEE Journal of Solid-State Circuits, Dec. 2004, pp. 2342-2348.

Zhao, et al., "Continuous-Time Digital Controller for High-Frequency DC-DC Converters", 2007, IEEE Applied Power Electronics Conference 2007, 26 pages.

International Search Report and Written Opinion, Jun. 7, 2009, 11 pages.

* cited by examiner

SELF-TUNING DIGITAL CURRENT ESTIMATOR FOR LOW-POWER SWITCHING CONVERTERS

CLAIM OF PRIORITY

This application claims priority from the following application, which is hereby incorporated in its entirety: U.S. Provisional Application No. 61/048,655 entitled: "SELF-TUNING DIGITAL CURRENT ESTIMATOR FOR LOW-POWER SWITCHING CONVERTERS", by Aleksandar Prodic, et al., filed Apr. 29, 2008.

BACKGROUND OF THE INVENTION

In low-power dc-dc converters, current sensing or measurement is not only used for protection from overload condition. It is often utilized for increasing converter efficiency through multi-mode operation and improving dynamic response. Generally, the measurement methods can be categorized as voltage drop and observer based methods. In voltage drop based methods, a current passing through a sense-resistor or a MOSFET is extracted from the voltage drop it causes. The observer-based systems usually estimate current from the voltage across the power stage inductor.

In most cases, the existing methods are not well-suited for the integration with rapidly emerging digital controllers of switch-mode power supplies (SMPS) for battery-powered portable devices, communications computers, consumer electronics, and other applications where the overall size, the system cost, and the overall efficiency are among the main concerns. The voltage drop methods either decrease efficiency of the converter or require a wide-bandwidth amplifier, which are very challenging to realize in the latest CMOS digital processes. This is due to very limited supply voltages of standard digital circuits (often in sub 1V range), at which traditional analog architectures cannot be used. Hence, bulkier and less reliable multi-chip solutions each requiring a sensing circuit and controller implemented in different IC technologies. On the other hand, the observers suffer from a limited accuracy. Typically, the current estimation relies on prior knowledge of the inductance and equivalent series resistance values, which depend on operating conditions and change under external influences, such as aging and temperature.

SUMMARY OF THE INVENTION

Embodiments of the present invention describe an inductor current estimator suitable for low-power digitally controlled switch-mode power supplies (SMPS). The estimation of the average current value over one switching cycle can be based on the analog-to-digital conversion of the inductor voltage and consequent adaptive signal filtering. The adaptive filter can be used to compensate for variations of the inductance and series equivalent resistance affecting accuracy of the estimation. Based on the response to an intentionally introduced and known current step, the filter can tune its own parameters such that a fast and accurate estimation is obtained.

DETAILED DESCRIPTION

Figure 1:
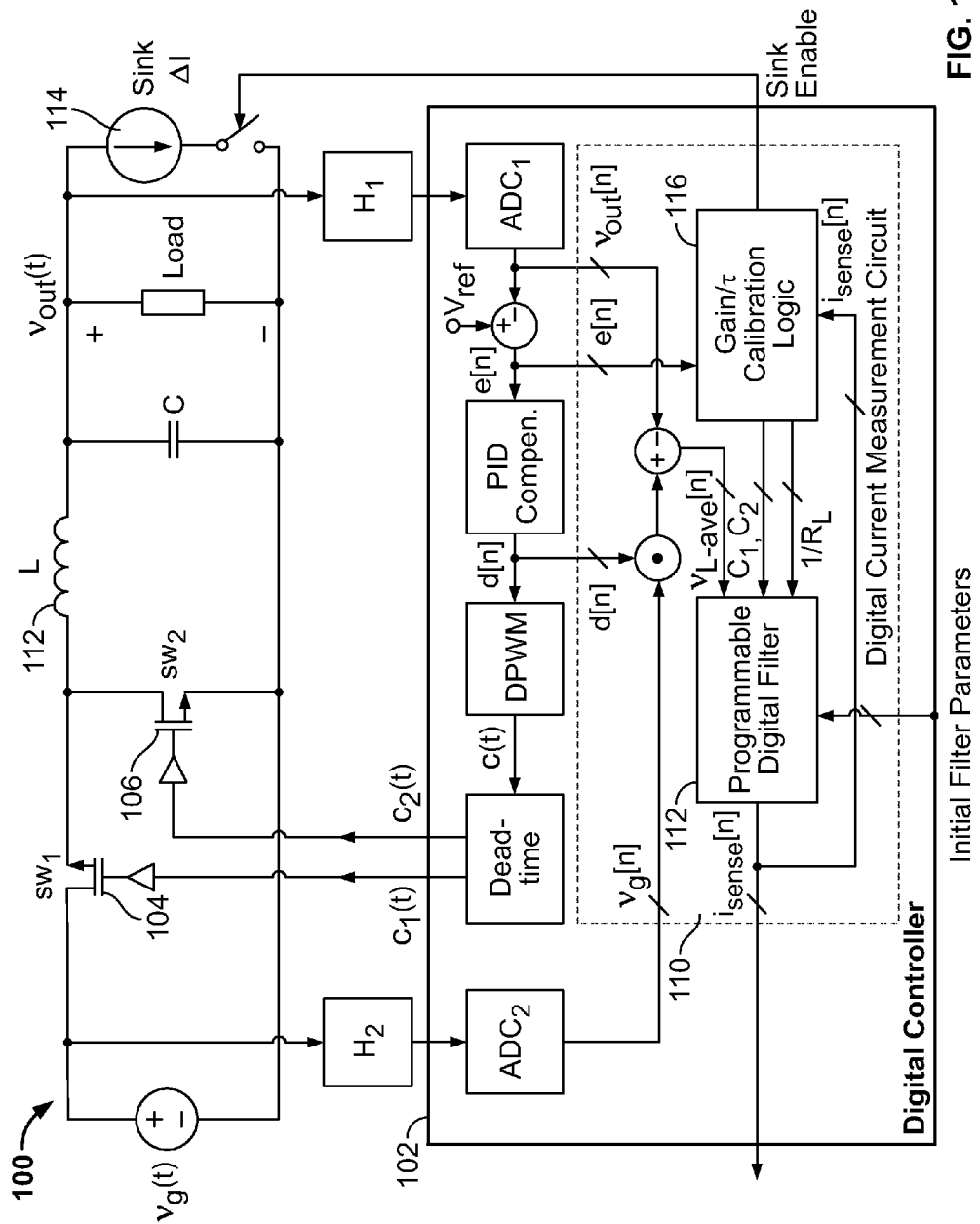
FIG. 1 is a diagram that shows a switched mode power supply (SMPS) using a self-tuning current estimator of one embodiment of the present invention.

A self-tuning current estimator, shown in FIG. 1 can utilize flexibility of digital implementation to compensate for the changes in the inductor parameters. The estimator can be fully implantable in the latest digital CMOS technologies allowing for a simple integration with the upcoming digital controllers.

In one embodiment, a switched mode power supply 100 comprises a digital controller 102 to control the switching of at least once switch 104 and 106 of the switched mode power supply 100. The current through the power inductor 112 can be estimated using a self-tuning digital current estimator 110.

The estimation of the inductor current can be used to limit the peak inductor current, in a current sharing multiphase current supply, as part of an average current control system and to improve dynamic response.

The digital current estimator 110 can estimate the current through the power inductor 112 by deriving from an indication of the voltage across the power inductor 112, such as an estimated average voltage across the inductor 112.

The estimate of average voltage across the power inductor can be estimated using an input voltage and output voltage of the switched mode power supply, as well as a derived duty cycle value.

A digital filter can be used to derive the estimate of the current through the power inductor. Calibration logic can adjust the coefficients of the digital filter.

The self tuning adjustments can use a current sink. The current sink can have a switch and resistor positioned across the load to produce a known current drop.

Calibration logic in the self tuning digital current estimator can adjust coefficients for the estimation of current through the power inductor based on the response of the estimated current to the use of the current sink. Deviation in the digital filter output DC value or overshoots and/or undershoots in the filter response can be used in the calibration.

If the estimated current is used for over-current protection, the digital controller can turn off the switched mode power supply when the estimated current exceeds a threshold valve.

Figures 2A, 2B:
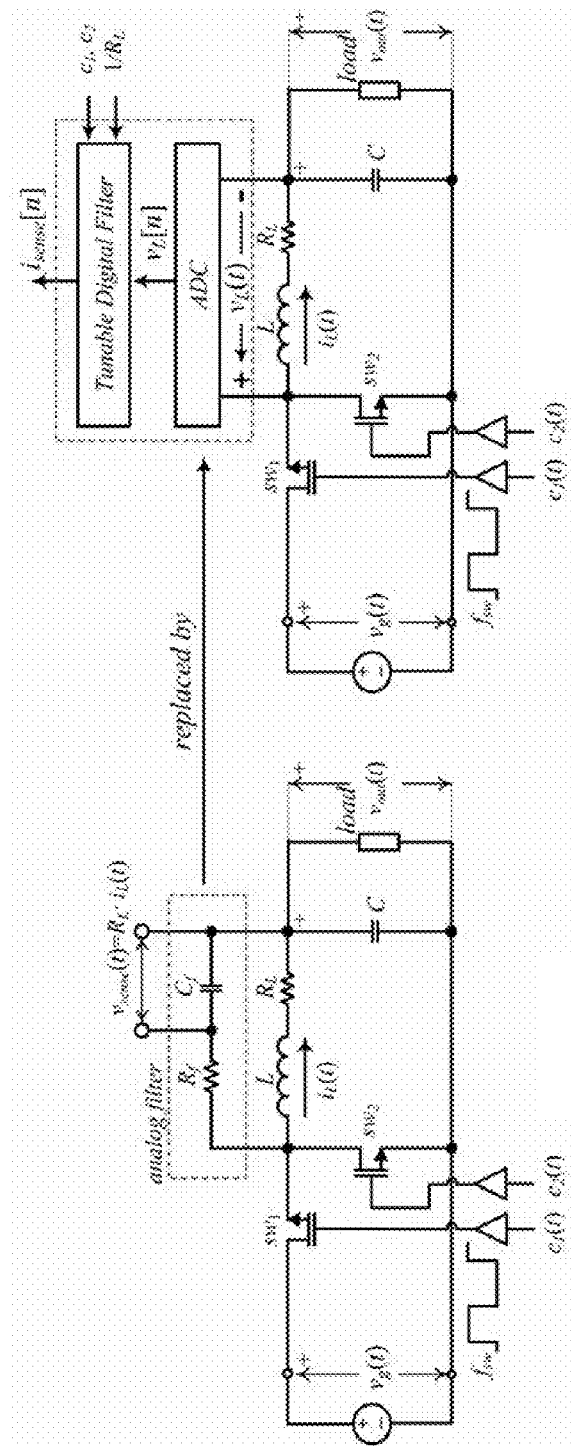
FIG. 2 is a diagram that shows current sensing techniques of one embodiment.

FIGS. 2A and 2B are used to explain the principle of operation of both the conventional analog current estimator and the self-tuning digital system introduced in this invention. In the analog implementation of FIG. 2A, the inductor current $i_L(t)$ is extracted by placing an R-C filter in parallel with the power stage inductor and measuring the filter's capacitor voltage $v_{sense}(t)$. The relationship between the voltage and the inductor current is given by the following transfer function:

$$V_{sense}(s) = I_L(s) \cdot R_L \cdot \frac{1+s \cdot \frac{L}{R_L}}{1+s \cdot R_f C_f} = I_L(s) \cdot R_L \cdot \frac{1+s \cdot \tau_L}{1+s \cdot \tau_f}, \quad (1)$$

where L and $R_L$ are the inductance and its equivalent series resistance values, respectively, and $R_f$ and $C_f$ are the values of the filter components. When the filter parameters are selected so that $\tau_f = R_f C_f = L/R_L = \tau_L$, the capacitor voltage becomes an undistorted scaled version of the inductor current (the zero and pole cancel each other). This allows the inductor current to be reconstructed from the capacitor voltage measurements.

The main drawback of this method is that the inductor parameters are not exactly known and do change in time, often causing large errors in the estimation. To compensate for these variations, an analog filter with programmable resistive networks has been proposed where, in the later publication, an on-chip implementation of the filter is shown. Even though the method significantly improves the estimator accuracy, its implementation still requires a relatively large number of analog components, making it less suitable for the integration with digital controllers or low-power SMPS.

In the new estimator of FIG. 2B, the analog filter is replaced with a fully-digital equivalent, where in contrast, the digital filter is tunable. In this implementation, the voltage across the inductor can be converted into a digital value $v_L[n]$ and then processed in the digital domain, to result in the output value $i_{sense}[n]$ directly proportional to the inductor current.

Figure 3:
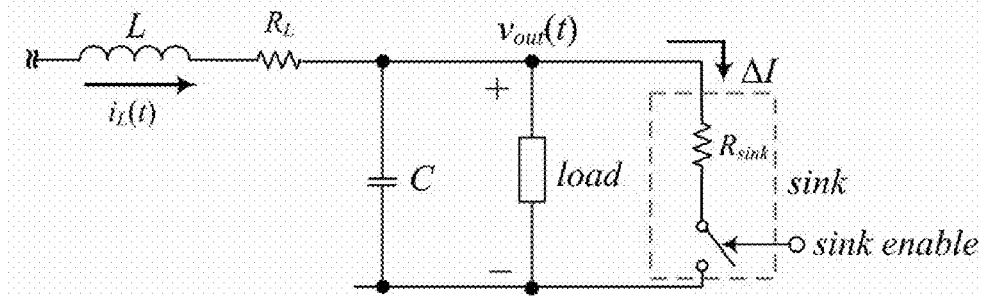
FIG. 3 is a diagram that shows an exemplary test current sink of one embodiment.

By manipulating equation (1) and applying a bilinear transformation the following difference equation for the digital filter can be derived:

$$i_{sense}[n] = \frac{1}{R_L} \cdot \{c_1 \cdot i_{sense}[n-1] + c_2 \cdot (v_L[n] + v_L[n-1])\}, \quad (2)$$

where $c_1$ and $c_2$ are filter coefficients:

$$c_1 = \left(2 \cdot \frac{L}{R_L T_s} - 1\right) \bigg/ \left(1 + 2 \cdot \frac{L}{R_L T_s}\right), \quad (3)$$

$$c_2 = \left(1 + 2 \cdot \frac{L}{R_L T_s}\right)^{-1}, \quad (4)$$

and $T_s$ is the filter sampling rate. The estimator adjusts the filter gain factor $1/R_L$ from equation (2) and coefficients $c_1$ and $c_2$ through a self-calibrating process. It can be obtained with the help of a test current sink connected at the converter output, as shown in FIGS. 1 and 3. Periodically, the sink 114, which can be implemented with a known resistor and a small switch connected parallel to the load, can turn on for a short time. Then, based on the response of the filter, the Gain/τ Calibration Logic 116, blocks can adjust the filter gain and coefficients so that the increase in $i_{sense}[n]$ corresponds to the increase in the load current.

Since the series inductor resistance $R_L$ and inductance L dynamically change, due to variations of converter operating conditions (e.g. output load current or temperature), the accuracy of the current estimation can be maintained.

Since the current sink of FIG. 3 does not require any change in converter operation, this method can be used during normal converter operation and the calibration can be performed regularly. The current sink calibration can be done at the start of the power supply operation or periodically during operation of the power supply. In one embodiment, the current sink provides a small change in the inductor current. In one embodiment, this small change is about 5% the total current.

A practical implementation of the self tuning digital estimator may not be straightforward. Seemingly, it requires a very fast ADC, with sampling rate significantly higher than the switching frequency, as well as an equally fast processor for the filter implementation. Each of these can make the presented estimator impractical for the cost-sensitive low-power applications.

Figure 4:
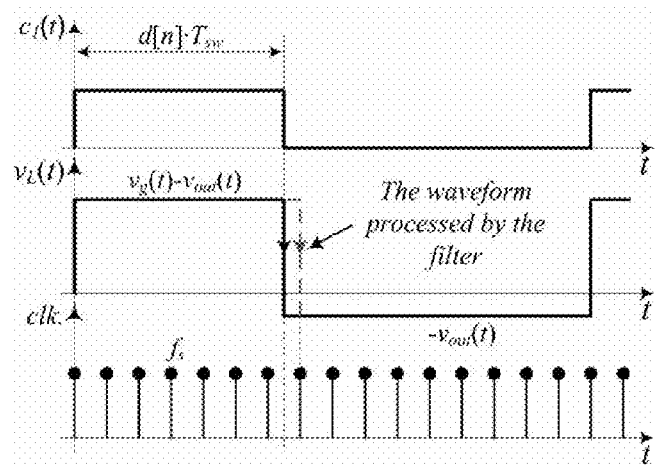
FIG. 4 is a diagram that shows an example using an over sampling analog-to-digital converter (ADC).

The precision and speed of the estimator depend on the accuracy of the measurement of the average value of the inductor voltage. Even a small error in the measurement can cause a large estimation error. To obtain a fast estimation, the accurate measurement of the inductor voltage over one switching cycle is required. It could be done with an ADC converter whose sampling rate is much higher than the switching frequency. The need for a very high sampling rate converter can be described through FIG. 4, showing the inductor voltage of a buck converter as well as its gate drive signal $c_1(t)$ and the sampling signal of a fast ADC. In this case, the average value of the inductor voltage can be calculated by summing the sampled voltage values and dividing the result with the number of samples taken during one switching cycle. However, as it can be seen from FIG. 4, the accuracy of this approach strongly depends on the number of samples taken, especially if the samples are not perfectly aligned with the inductor voltage transition point.

To eliminate the need for the fast ADC, the input voltage of the power stage $v_g(t)$ can be sampled at a rate lower than switching frequency and the average value of the inductor voltage is calculated as:

$$v_{L-ave}[n] = d[n] \cdot v_g[n] - v_{out}[n], \quad (5)$$

where d[n] is DPWM's duty cycle control variable and $v_{out}[n]$ is the converter output voltage, both of which can be readily available in the control loop of FIG. 1. The $v_{out}[n]$ can be provided by the already existing ADC of the voltage control loop and the duty ratio, d[n], can be provided by the digital compensator. A lower sampling rate is possible because in the targeted battery-powered applications the input voltage often changes in a very slow fashion. It should be noted that the complete implementation of the new estimator, including ADCs is possible in standard CMOS processes. Recent publications show application-specific ADCs for SMPS that are fully implantable in the latest low-voltage technologies.

Figure 5:
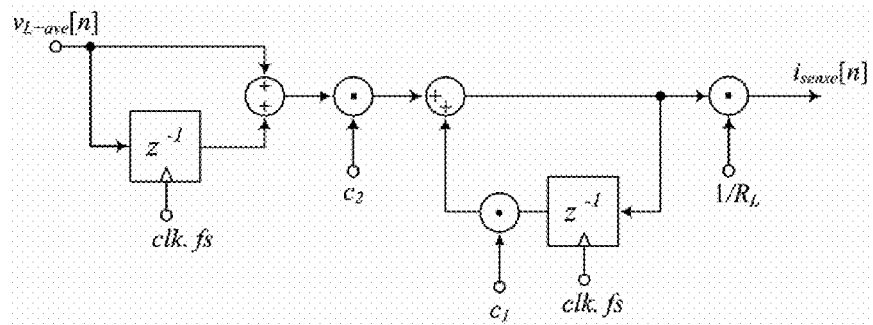
FIG. 5 is a diagram that shows an exemplary digital filter architecture that can be used with the system of the present invention.

The calculation of the average voltage described in the previous subsection reduces hardware requirements but at the same time affects the estimation accuracy. The actual average inductor voltage might differ from equation (5), due to the action of non-overlapping, i.e. dead-time circuit, and other parasitic effects. To compensate for this effect, as well as for the previously mentioned variations in the inductor values, a current sink and Gain/τ Calibration Logic 116 (FIG. 1) are used to tune the parameters of the infinite impulse response (IIR) digital filter, an exemplary block diagram for an IIR digital filter, is shown in FIG. 5. The calibration of the filter coefficients can be described with equation (2) is performed in two phases.

In the first phase, a known load current step is introduced by the sink and the accurate value $1/R_L$ is found from the variation in the estimated inductor current.

In the next phase, another current step is introduced and the time constant $\tau_L = L/R_L$, determining coefficients $c_1$ and $c_2$ are calculated from the estimator output overshoot/undershoot.

A more detailed description of an exemplary calibration procedure is given in the following subsection.

The block named Gain/$\tau$ Calibration Logic 116, shown in FIG. 1 can, periodically, perform the calibration procedure. The value of $1/R_L$ can be determined from the difference between two steady state current values, estimated before and after a load step is applied as shown in FIG. 6.

Figure 6:
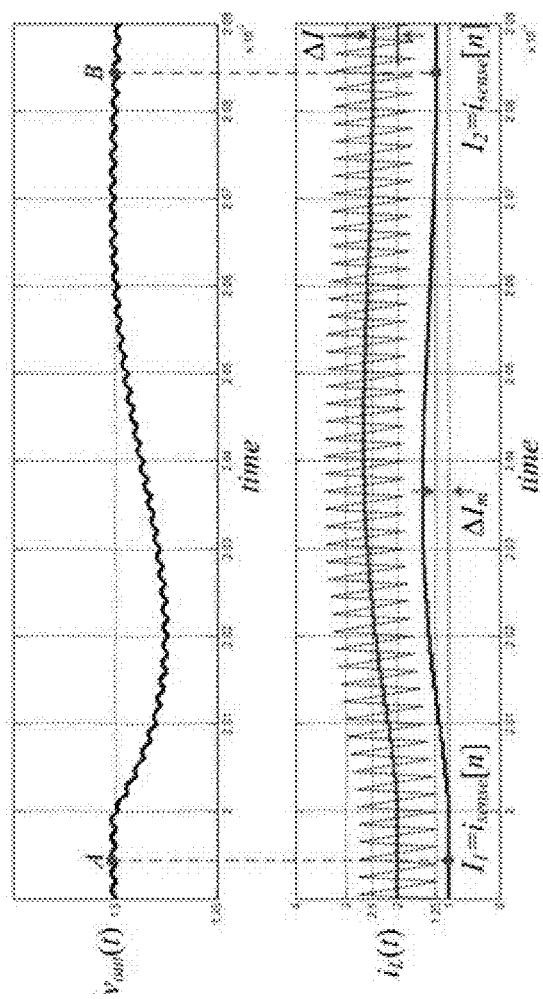
FIG. 6 is a diagram that shows an example of a $R_L$ calibration of one embodiment.

FIG. 6 shows an exemplary $R_L$ calibration procedure: simulated response of the current estimator during output load change for two cases (bottom) the initial value of $R_L$ is half the actual value (top) after the filter adjustment.

The initial steady state is detected by monitoring the error signal $e[n]$ and at the time instant A (FIG. 6), the current, before the transient, is estimated $I_1 = i_{sense}[n]$ and stored in a register. After a step $\Delta I$ is introduced and steady state reached again the new current $I_2 = i_{sense}[n]$ is found and difference $\Delta I_m$ $$\Delta I_m = I_2 - I_1 \quad (6)$$

$$R_L = \frac{\Delta I_m}{\Delta I} R_{L\_inital}, \quad (7)$$

where $R_{L\_initial}$ is the initially set resistance value.

Figure 7:
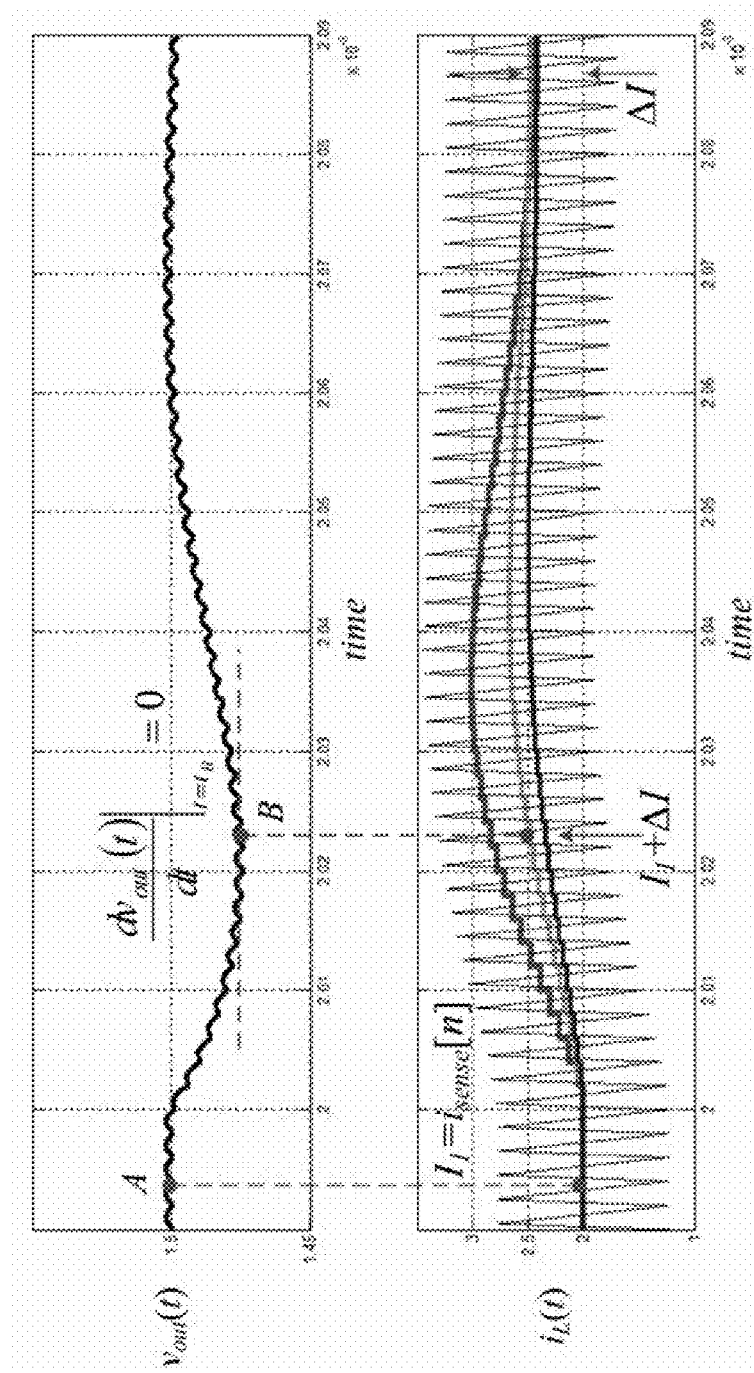
FIG. 7 is a diagram that shows an example of a time constraint calibration of one embodiment.

The uncertainty of an actual inductor value L affects the time constant $\tau_f(1)$ and therefore the time response of the filter. This effect is demonstrated in FIG. 7 showing the actual and estimated inductor currents during a load step for three different time constants: the actual time constant $\tau_L$, and ±50% of this value. In FIG. 7, a simulated response of the current estimator during output load change between 2 A and 2.5 A; (top) for $\tau_f = 0.5 \tau_L$; (middle) for $\tau_f = \tau_L$; (bottom) for $\tau_f = 1.5 \tau_L$.

It can be seen that the estimated current accurately follows $i_L(t)$ only when a proper set of filter coefficients for the actual inductor value L is set. In two other cases, the estimated current exhibits overshoot for $\tau_f$ smaller than actual value and undershoot when $\tau_f$ is larger.

The calibration of the $\tau_f$ can be performed during the transient, at the output voltage valley point (time instant B in FIG. 7), where the inductor current is equal to that of the load. At this time instant the estimated current is compared with the expected value $I_1 + \Delta I$ and tuning of the filter time constant is performed.

An experimental system was built based on the diagrams shown in FIGS. 1, 3 and 5. The power stage is a 15-W, 1.5-V buck converter, switching at $f_{SW} = 500$ kHz, with the input voltage ranging between 2V and 6.5V. The digital filter, calibration logic and controller are realized with an Altera DE2 FPGA board. Two external ADCs sampling at $f_{sw}$ and $f_{sw}/10$ are used for output and input voltage measurements respectively. The test current sink was set to produce a 500 mA pulse, which is only 5% of the maximum output current. To visualize the operation of the estimator, its digital output was sent to a flash digital-to-analog converter (DAC) and the resulting analog signal was observed.

Figure 8:
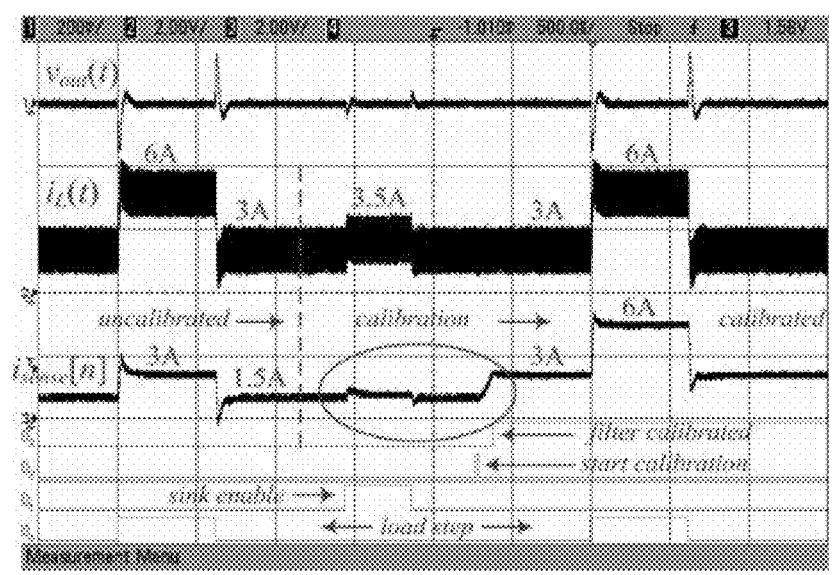
FIG. 8 is a diagram that shows system operation of one embodiment.

FIG. 8 shows the system operation, of one embodiment. Channel 1 has an Output converter voltage (200 mV/div); Channel 2 has actual inductor current $i_L(t)$ (2 A/V). Channel 3 has estimated average current $i_L[n]$ (2 A/V). D0-D3 is control signals. The Time scale is 500 µs/div.

Figure 9:
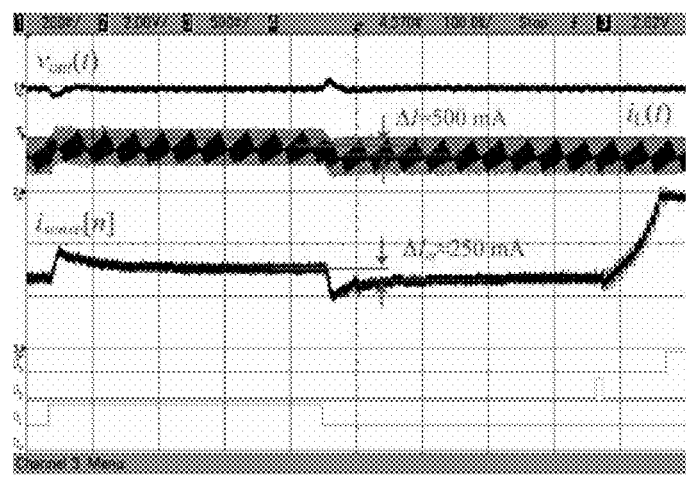
FIG. 9 is a diagram that shows a calibration procedure of one embodiment.

FIG. 9 shows the calibration procedure, of one embodiment, using a 0.5 A current sink. Channel 1 is Output converter voltage (200 mV/div). Channel 2 is actual inductor current $i_L(t)$ (2 A/V). Channel 3 is estimated average current $i_L[n]$ (2 A/V). D0-D3 are control signals. The Time scale is 100 µs/div.

FIG. 8 and its zoomed version, FIG. 9, show closed loop operation of the controller during load transients between 3 A and 6 A and demonstrate self-tuning process of the estimator. In the first (uncalibrated) phase due to the mismatch in equivalent series resistance $R_L$, the gain $1/R_L$ and coefficients of the estimator are not properly adjusted and an error of approximately 100% in the current estimation occurs (the step is wrongly recognized as a 1.5 A to 3 A transition). In the second (calibration) phase, a 0.5 A test-current step is introduced and the filter gain and the coefficients of the filter are tuned accordingly. The third phase shows repeated load transient, where the average current is estimated accurately, verifying the effectiveness of the self-tuning filter and the estimator operation.

Figure 10:
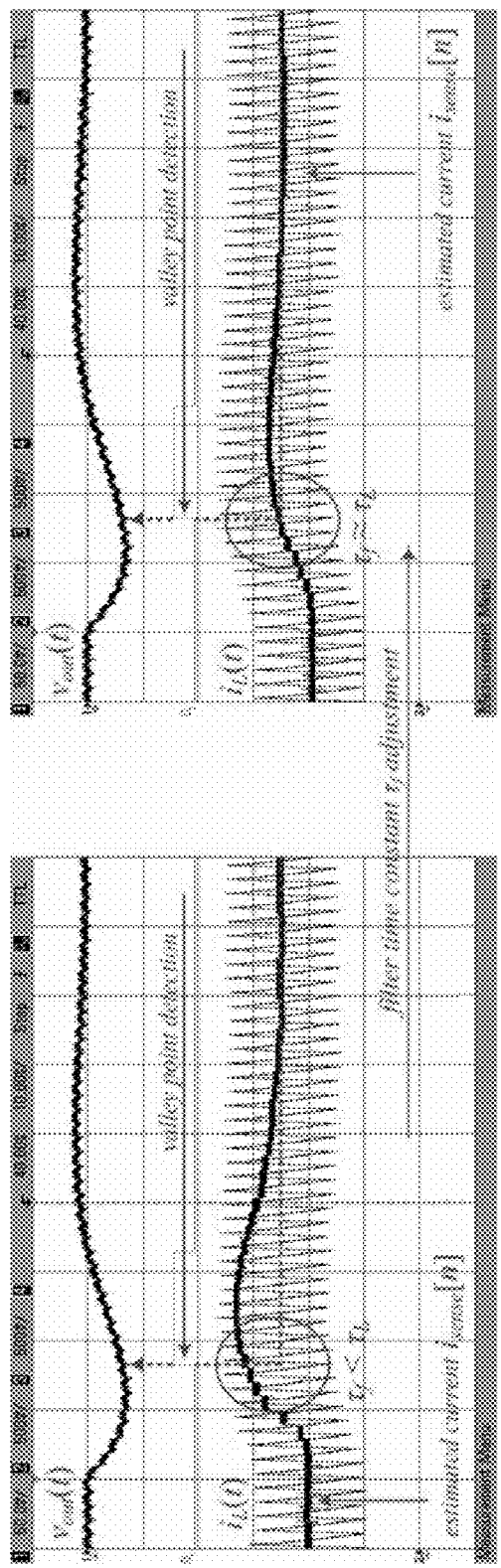
FIG. 10 is a diagram that shows filter time constant tuning of one embodiment.

Tuning process of the filter time constant $\tau_f$ due to the variation of the inductance value L is demonstrated in FIG. 10.

FIG. 10 shows an example with the estimator IIR filter time constant $\tau_f$ is tuned (left) iteratively to match the inductor time constant $\tau_L$ (right): Output converter voltage (50 mV/div). Channel 2 is actual inductor current $i_L(t)$ (2 A/V). Channel 3 is estimated average current $i_L[n]$ (2 A/V). The Time scale is 10 µs/div. Initially, the filter time constant $\tau_f$ is half the inductor time constant $\tau_L$ and the estimated current exhibits an overshoot above the expected steady-state value at the output voltage valley point. This is recognized by the gain/$\tau$ calibration logic which automatically reduces time constant $\tau_f$ by readjusting filter coefficients $c_1$ and $c_2$ until the time constants are closely matched as shown in FIG. 10 (right).

Figure 11:
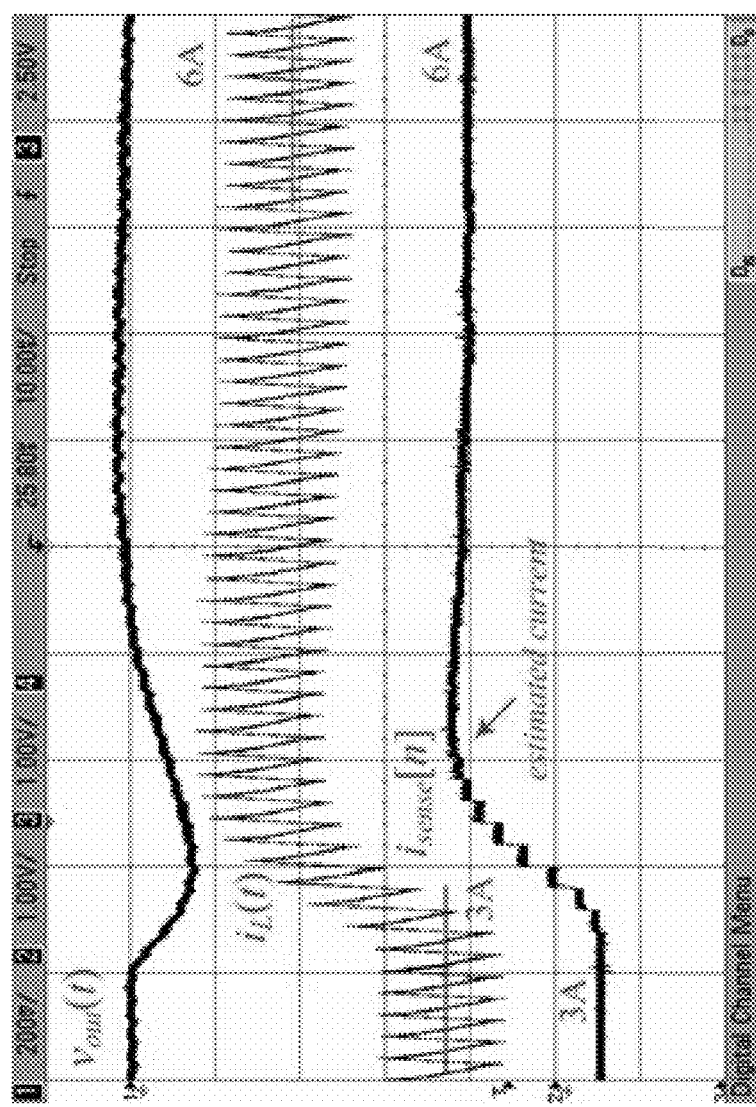
FIGS. 11 and 12 are diagrams that show examples of current estimation.
Figure 12:
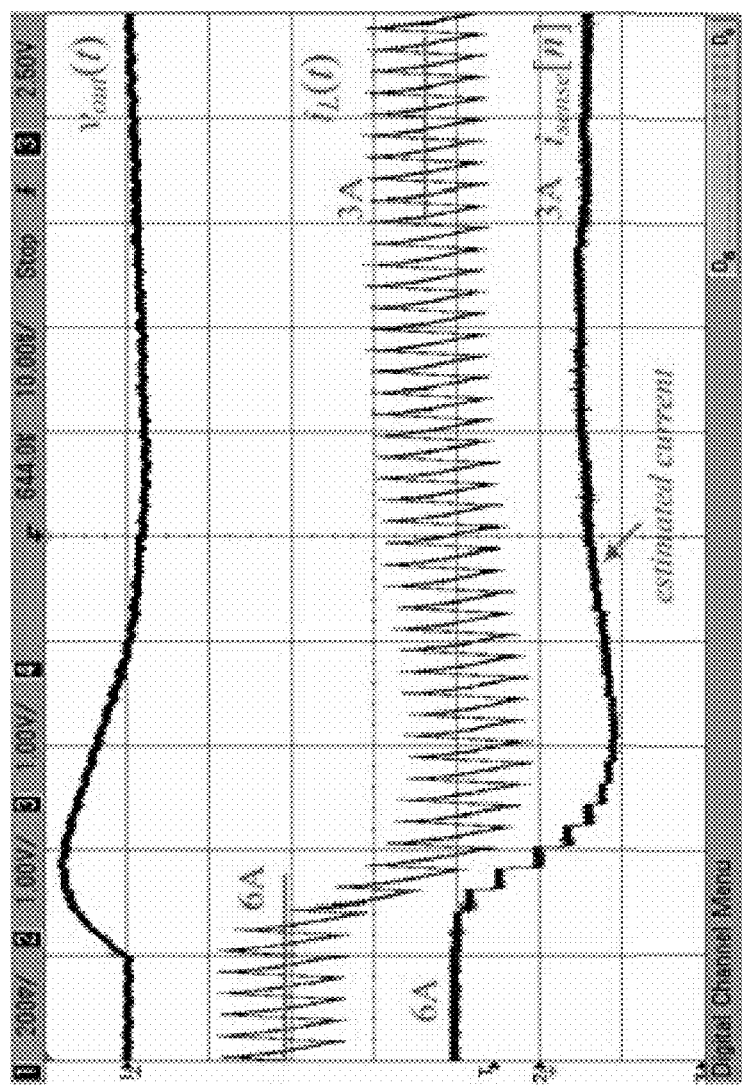

FIGS. 11 and 12 demonstrate fast operation of the estimator when both gain and time constant are properly tuned.

FIG. 11 shows the estimated current during light-to-heavy load step between 3 A and 6 A. Channel 1 is Output converter voltage (200 mV/div). Channel 2 is actual inductor current $i_L(t)$ (2 A/V). Channel 3 is estimated average current $i_L[n]$ (2 A/V). The Time scale is 10 µs/div.

FIG. 12 shows the estimated current during heavy-to-light load step between 6 A and 3 A. Channel 1 is Output converter voltage (200 mV/div). Channel 2 is actual inductor current $i_L(t)$ (2 A/V). Channel 3 is estimated average current $i_L[n]$ (2 A/V). The Time scale is 10 µs/div.

FIGS. 11 and 12 compare actual and estimated inductor current during both light-to-heavy and heavy-to-light load changes between 3 A and 6 A. As it can be seen, the average value of the current over one switching cycle is accurately estimated without significant delay, allowing the estimator to be used for overload protection and power stage efficiency optimization.

A simple overload protection of the converter circuitry can be obtained by comparing the output of the current estimator with a predefined digital current threshold. Once the estimated current exceeds the threshold value, to prevent the converter damage, it is immediately turned off and the estimator stops its operation as shown in FIG. 13.

Figure 13:
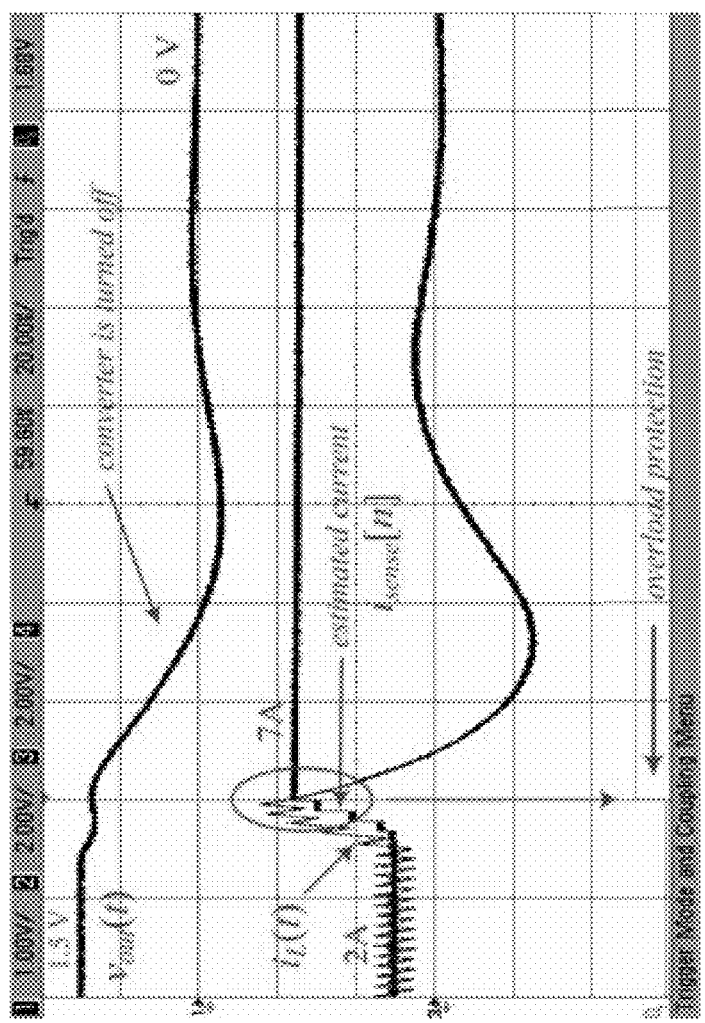
FIG. 13 is a diagram that shows overload protection of one embodiment.

In the example of FIG. 13, the output load current is intentionally increased from 2 A to 7.5 A above the threshold of 7

A. Therefore the overload protection signal is activated and converter is rapidly turned off.

FIG. 13 shows the overload protection implemented with the current estimator-Channel 1 is Output converter voltage (1V/div). Channel 2 is actual inductor current $i_L(t)$ (2 A/V). Channel 3 is estimated average current $i_L[n]$ (2 A/V). The Time scale is 20 μs/div.

The accuracy of the current estimator is tested by changing the output load current between 0.5 A and 10.3 A (maximum load) and monitoring the estimated current. The obtained data is shown in FIG. 14.

Figure 14:
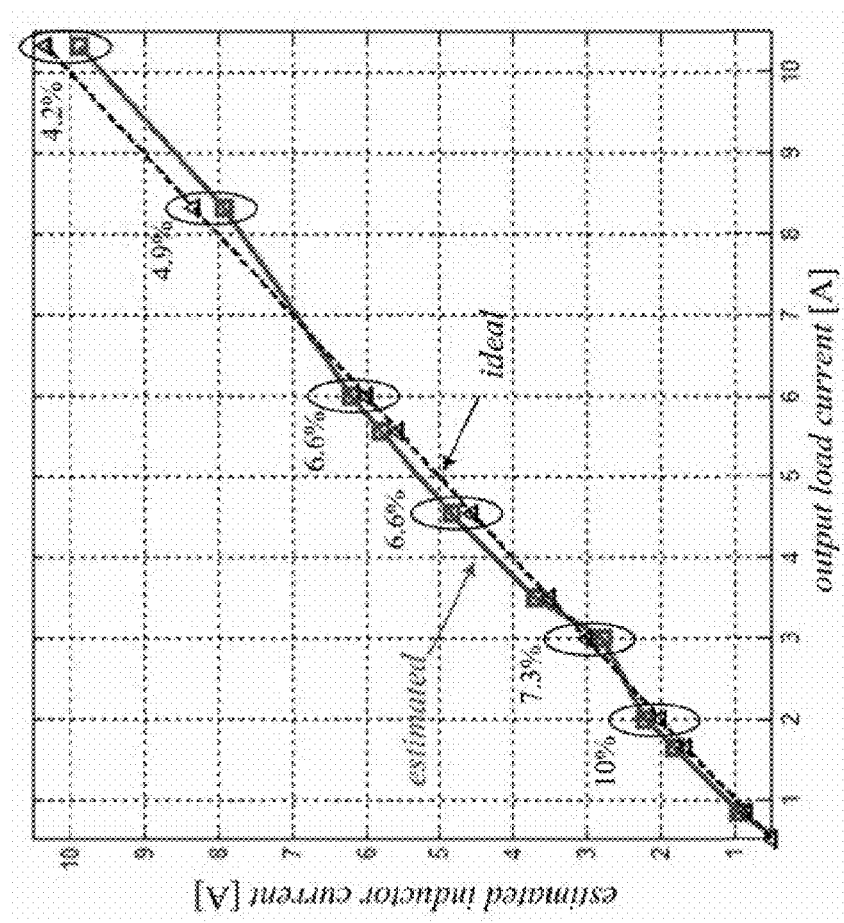
FIG. 14 is a diagram that shows estimate inductor current versus output load current of one embodiment.

FIG. 14 shows estimated inductor current versus the output load current

It can be seen that the current estimator has accuracy better than 10% between 20% and 100% of the maximum load current with 5% accuracy at the maximum load current. These results meet or surpass the most recent analog solution demonstrated in where an accuracy of 8% was achieved.

The foregoing description of preferred embodiments of the present invention has been provided for the purposes of illustration and description. It is not intended to be exhaustive or to limit the invention to the precise forms disclosed. Many embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the claims and their equivalents.

The invention claimed is:

1. A switched mode power supply comprising:
   at least one switch;
   a power inductor;
   a digital controller to control the switching of the at least one switch of the switched mode power supply; wherein the current power through the inductor is estimated using a self-tuning digital current estimator;
   wherein the self-tuning digital current estimator estimates the current through the power inductor by deriving it from an estimate of the voltage across the power inductor; and
   wherein a digital filter is used to derive the estimate of the power inductor current from the estimate of the voltage across the power inductor.

2. The switched mode power supply of claim 1, wherein the digital controller turns off the switched mode power supply when the estimated current exceeds a threshold value.

3. The switched mode power supply of claim 1, wherein the estimate of voltage across the power inductor is an estimate of the average voltage across the power inductor.

4. The switched mode power supply of claim 3, wherein the estimate of average voltage across the power inductor is estimated using an input voltage and output voltage for the switched mode power supply.

5. The switch mode power supply of claim 3, wherein the estimate of the average value of the voltage across the power inductor is performed from the values of the regulated output voltage and duty ratio control variable.

6. The switched mode power supply of claim 1, wherein the self tuning digital current estimator uses a current sink.

7. The switched mode power supply of claim 6, wherein the current sink uses a switch and resistor positioned across a load of the switched mode power supply.

8. The switched mode power supply of claim 6, wherein calibration logic in the self tuning digital current estimator adjusts coefficients for the estimation of current through the power inductor based on the response of the estimated current value to the operation of the current sink.

9. The switched mode power supply of claim 1, wherein the adjustment is done as a result of a test current sink.

10. The switched mode power supply of claim 1, wherein calibration logic adjusts the coefficients of the digital filter.

11. The switched mode power supply of claim 10, wherein overshoots and/or undershoots in the filter response are used in the adjustment.

12. The switched mode power supply of claim 10, wherein a deviation in the digital filter output DC value is used in the adjustment.

13. A switched mode power supply comprising:
    at least one switch;
    a power inductor;
    a digital controller to control the switching of the at least one switch of the switched mode power supply; wherein the current through the power inductor is estimated using a self-tuning digital current estimator; and wherein the self tuning uses a current sink.

14. The switched mode power supply of claim 13, wherein the current sink uses a switch and resistor positioned across a load of the switched mode power supply.

15. The switched mode power supply of claim 13, wherein calibration logic in the self tuning digital current estimator adjusts coefficients for the estimation of current through the power inductor based on the response of the estimated current value to the operation of the current sink.

16. A current estimator comprising:
    a digital filter to produce a current estimate from a voltage based input value;
    a current sink to produce an increase in the current; and
    calibration logic to update coefficients for the digital filter based on the current increase produced by the current sink.

17. The current estimator of claim 16, wherein overshoots and/or undershoots in the digital filter response to the current increase are used to determine the update of the coefficients.

18. The current estimator of claim 16, wherein the current sink comprises a switch and a resistor.

19. A switched mode power supply using the current estimator of claim 16.

20. The current estimator of claim 16, wherein a deviation in the output DC value of the digital filter in response to the current increase is used to determine the update of the coefficients.

* * * * *